United States Patent [19]
Scavennec et al.

[11] Patent Number: 6,107,652
[45] Date of Patent: Aug. 22, 2000

[54] METAL-SEMICONDUCTOR-METAL PHOTODETECTOR

[75] Inventors: André Scavennec, Paris, France; Abdelkader Temmar, Oran, Algeria

[73] Assignee: France Telecom, France

[21] Appl. No.: 09/008,276

[22] Filed: Jan. 16, 1998

[30] Foreign Application Priority Data

Jan. 17, 1997 [FR] France ................................. 97 00464

[51] Int. Cl.$^7$ ...................... H01L 31/072; H01L 31/109; H01L 31/0328; H01L 31/0336
[52] U.S. Cl. ......................... 257/184; 257/185; 257/449; 257/450; 257/451; 257/453; 438/93; 438/94
[58] Field of Search ................... 257/184, 185, 257/449, 457, 450, 453, 451; 438/93, 94

[56] References Cited

U.S. PATENT DOCUMENTS

| | | | |
|---|---|---|---|
| 4,939,561 | 7/1990 | Yamaka et al. | 357/30 |
| 5,101,254 | 3/1992 | Hamana | 357/30 |
| 5,652,435 | 7/1997 | Martin et al. | 257/21 |

FOREIGN PATENT DOCUMENTS

| | | |
|---|---|---|
| 0 457 483 | 5/1991 | European Pat. Off. ........ G02F 1/015 |
| 2 620 268 | 9/1987 | France . |

OTHER PUBLICATIONS

Marso M et al., Electrical Behaviour of the InP/InFaAs based MSM–2DEG diode, Solid–State Electronics, Jan. 1997, vol. 41, No. 1, pp. 25–31.

Hargis M C et al., Temporal and Spectral Characteristics of Back–Illuminated Ingaas Metal–Semicaobnductor–Metal Photodetectors, IEEE Photonics Technology Letters, vol. 8 No. 1, Jan. 1, 1996, pp. 110–112.

Chang–Xin Shi et al., High–Performance Undoped inp/ N–Ino.53AO.47AS MSM Photodetectors Grown by LP–Movpe, IEEE Transactions on Electron Devices, vol. 39, No. 5, May 1, 1992, pp. 1028–1031.

Yuang R –H et al., High–Performance Large–Area Ingaas MSM Photodetectors with a Pseudomorphic Ingap Cap Layer, IEEE Photonics Technology Letters, vol. 7, No. 8, Aug. 1, 1995, pp. 914–916.

*Primary Examiner*—William Mintel
*Attorney, Agent, or Firm*—Blakely Sokoloff Taylor & Zafman

[57] ABSTRACT

A metal-semiconductor-metal photodetector including an absorbent layer, a barrier layer of greater forbidden band energy on which there are deposited Schottky electrodes and a transition layer of graded composition, the photodetector including a doping plane situated in the vicinity of the join between the absorbent layer and the transition layer of graded composition.

7 Claims, 3 Drawing Sheets

METAL-SEMICONDUCTOR-METAL PHOTODETECTOR

FIELD OF THE INVENTION

The present invention relates to photodetectors of the metal-semiconductor-metal (MSM) type, and more particularly to components including a semiconductor layer between the photosensitive layer and the metal contacts for the purpose of increasing the height of the Schottky barrier.

Advantageously, the invention is applied particularly to AlInAs/GaInAs photodetectors on an InP substrate used at wavelengths of 1.3 µm and 1.55 µm.

BACKGROUND OF THE INVENTION

MSM type photodetectors on a GaAs substrate have operating characteristics (dark current, speed, sensitivity) that are entirely satisfactory and they are completely compatible technologically with MESFET type field-effect transistors. Components of this type have been developed in particular in the form of integrated photoreceivers and more particularly in the form of monolithic strips of photoreceivers. In this respect, reference may advantageously be made to:

[1] J. Choi et al., "High-performance high-yield, uniform 32-channel optical receiver array", OFC'96 Technical Digest, pp. 309–310.

Since GaAs is not photosensitive at 1.3 µm and at 1.55 µm, various laboratories have investigated MSM photodetectors having a GaInAs absorbent layer 2. As shown in FIGS. 1 and 2, such photodetectors are generally constituted by a stack of a plurality of layers grown epitaxiallly on a substrate 3 of indium phosphide (InP). Above a possible buffer layer 4 intended to keep the active zone of the component apart from surface defects of the substrate, there can be found an active layer 2 that is photosensitive and is made of GaInAs, followed by a transition layer 5 of graded composition made of AlGaInAs, and finally a barrier layer 6 of AlInAs. The graded composition layer may be obtained in various ways, by continuously varying composition or by juxtaposing a plurality of fine layers having given compositions, for example.

Two very fine electrode combs 1 (of width <1 µm) that are interdigitated with small spacing (about 1 µm to 3 µm) are then deposited on the barrier layer 6. These electrodes 1 co-operate with the semiconductor material that constitutes Schottky type junctions, collecting the carriers created by photons being absorbed in the semi-conductor.

Embodiments of this kind are described, in particular, in the following:

[2] H. T. Griem et al., "Long-wavelength (1.0–1.6 µm) $In_{0.52}Al_{0.48}As / In_{0.53}(Ga_xAl_{1-x})_{0.47}As / In_{0.53}Ga_{0.47}As$ metal-semiconductor-metal photodetector", Appl. Phys. Lett. 56 (11), Mar. 12, 1990, pp. 1067–1068; and

[3] M. C. Hargis et al., "Temporal and spectral characteristics of back-illuminated InGaAs metal-semiconductor-metal photodetectors", IEEE Photon. Technol. Lett. Vol. 8 (1996), No. 1, pp. 110–112.

Apart from the substrate which is generally doped with iron (Fe) in order to make it semi-insulating, the set of layers 3, 4, 5, and 6 is generally not doped. It should be observed that other materials have been mentioned in the literature for making the barrier layer 6, such as InP that is not doped, that is of p type, or that is semi-insulating (Fe doped). In this respect, reference may be made to the following:

[4] C. X. Shi et al., "High-performance undoped InP/n-$In_{0.53}Ga_{0.47}As$ MSM photodetectors grown by LP-MOVPE", IEEE Trans. Electron. Dev. Vol. 39, No. 5, May 5, 1992, pp. 1028–1030; and

[5] R. H. Yuang et al., "High-performance large-area InGaAs MSM photodetectors with a pseudomorphic InGaP cap layer", IEEE Photon. Technol. Lett. Vol. 7, No. 8 (1995), pp. 914–916.

In the structure of FIGS. 1 and 2, AlGaInAs transition layer 5 serves to eliminate carriers being trapped at the AlInAs/GaInAs heterojunctions; the graded nature of the composition makes it possible to provide a progressive transition from the conduction and valence bands of GaInAs to those of AlInAs. Nevertheless, it is necessary to apply a large voltage to ensure that the barriers which oppose electrons and holes collecting at the contacts disappear completely.

FIG. 3 shows the electric field lines E of a component of the type shown in FIGS. 1 and 2.

Under normal conditions, both metal/semiconductor junctions are biased, one of them forwards and the other one reversed.

Applying a high bias voltage as is required in order to obtain a large passband is naturally harmful with respect to obtaining low dark current, and that degrades the overall performance of the detector. In addition, reliability is certainly degraded in that device where the highest electric fields are on the surface and apply to all of the surface of the photodetector. Finally, the use of voltages higher than those required for proper operation of the associated electronic circuits is always penalizing, from the point of view of the electricity consumed by the receiver module.

In the special case of AlInAs/GaInAs photodiodes having n-type residual doping for the layers 2 of GaInAs, it is the configuration of the bands adjacent to the positive electrode 1 that plays a major role. This electrode 1 collects the electrons and it is therefore the discontinuity between the conduction bands (0.55 eV) that determines the voltage that needs to be applied. For example, for a transition layer having a thickness of 200 nm, it is necessary to have an electric field of 0.55/200 V/nm, i.e. 27.5 kV/cm to eliminate the barrier opposing electron collection. Given the residual doping of the absorbent layer 2 and the distance between the electrodes 1 which is typically 1 µm to 2 µm, it is difficult to achieve such a field at low voltage (at a bias of 5 V, the field provided by the external voltage is still negligible). A smaller field would suffice if the transition layer were thicker, however that would be to the detriment of the overall speed of the device since the photosensitive zone would then be further away from the electrodes. In practice, and for an absorbent layer 2 having a thickness of 1 µm to 2 µm (necessary for good absorption at 1.3 µm and at 1.5 µm) and for electrodes that are spaced apart by 2 µm, it is necessary to apply about 15 V in order to obtain satisfactory bandpass characteristics. At lower voltages, carriers become trapped, thereby restricting the passband and giving rise to very long smearing in the impulse response.

OBJECTS AND SUMMARY OF THE INVENTION

An object of the invention is to provide a photodiode structure of the metal-semiconductor-metal type that makes it possible to operate with low bias voltages.

To this end, the invention provides a structure similar to that described with reference to FIGS. 1 and 2, in which operation is improved by including a doping plane in the immediate vicinity of the transition zone between the photosensitive layer and the layer of graded composition. This doping plane makes it possible to modify the band structure of the component, and in particular to reduce the electric field required for obtaining satisfactory carrier collection.

Thus, the invention provides a metal-semiconductor-metal photodetector including an absorbent layer, a barrier layer of greater forbidden band energy on which there are deposited Schottky electrodes and a transition layer of graded composition, the photodetector including a doping plane situated in the vicinity of the join between the absorbent layer and the transition layer of graded composition.

BRIEF DESCRIPTION OF THE DRAWINGS

Other characteristics and advantages of the invention appear further from the following description. This description is purely illustrative and non-limiting. It should be read with reference to the accompanying drawings, in which.

MORE DETAILED DESCRIPTION

Figure 4:
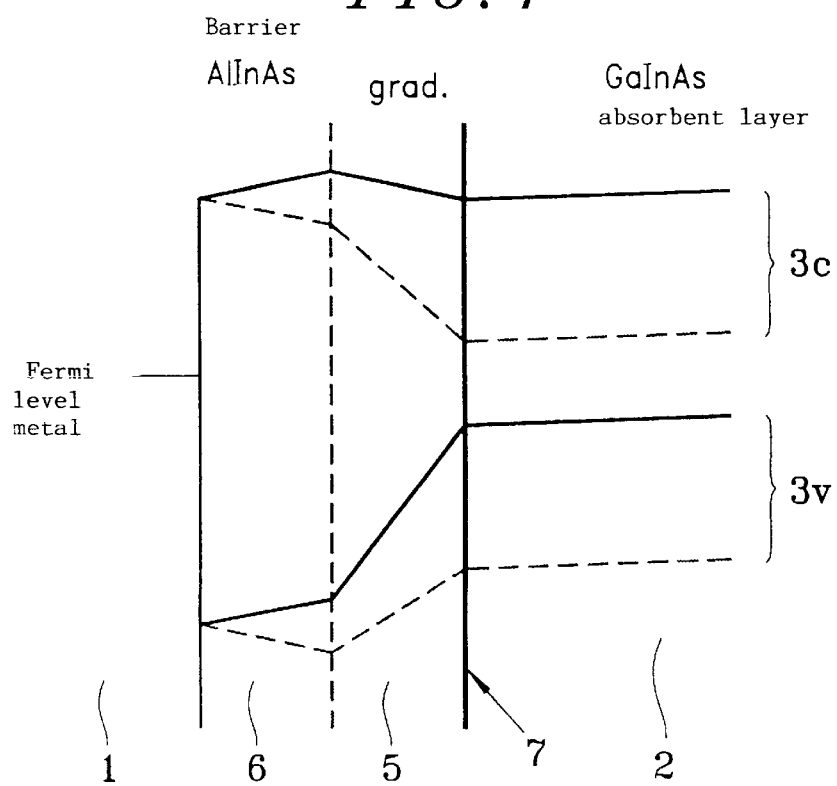
FIG. 4 is a graph in which the energy of the conduction band and of the valence band in an MSM photodiode constituting one possible embodiment of the invention are plotted.
Figure 5:
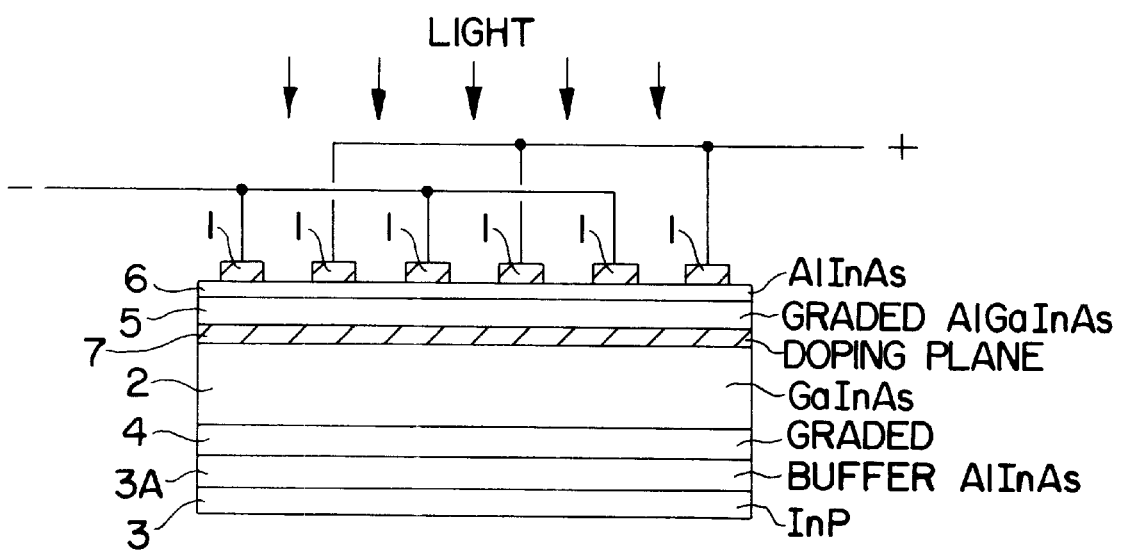
FIG. 5 is a section view of an embodiment of an MSM photodiode according to the invention.

In FIG. 4, only that portion which corresponds to the positively biased electrode is shown.

Figure 1:
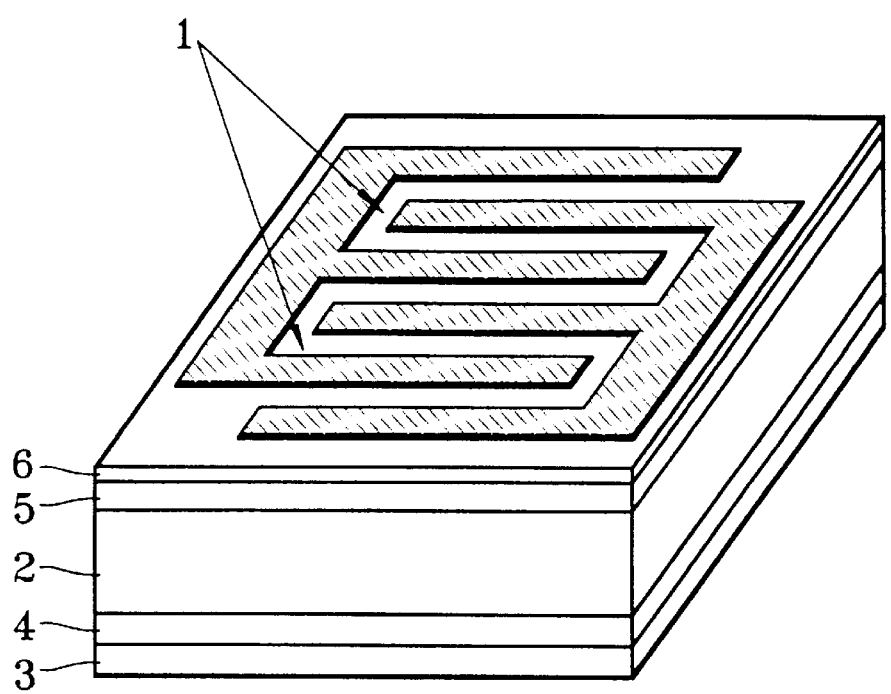
FIGS. 1 and 2, described above, are diagrams respectively constituting a perspective view and a section view of a prior art MSM photodiode.
Figure 2:
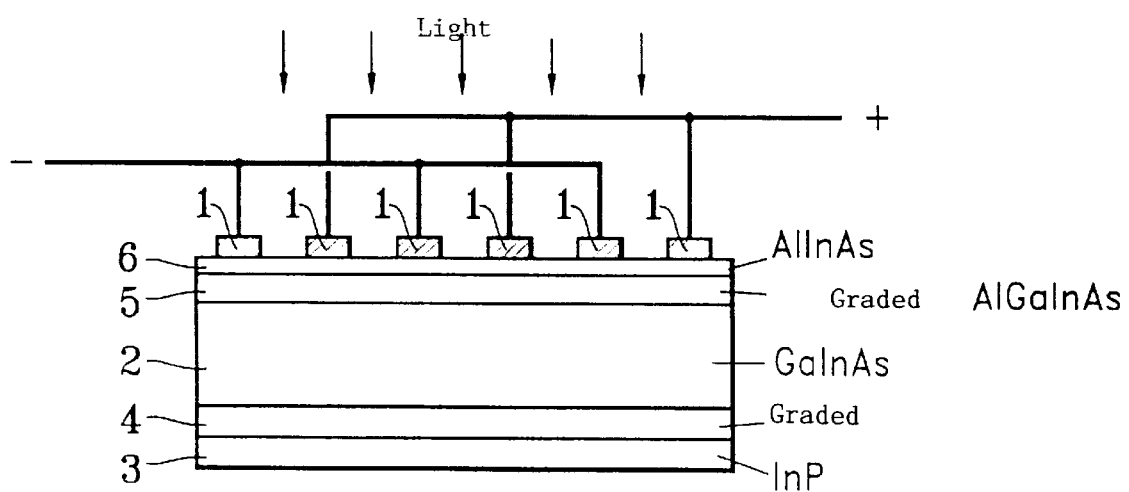
Figure 3:
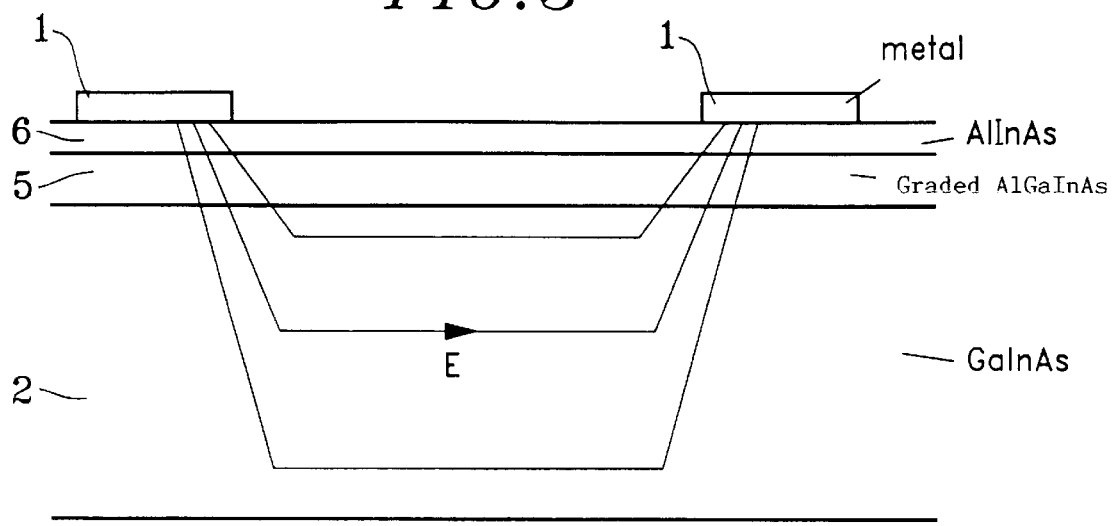
FIG. 3, as described above, is a diagrammatic section through the component of FIGS. 1 and 2, in which the electric field lines in the component are also shown for a single pair of electrodes.

The energy levels of the conduction band CB and of the valence band VB shown in dashed lines in FIG. 4 corresponds to those of the structure of FIGS. 1 to 3; the levels shown in continuous lines correspond to the same structure in which a doping plane 7 has been added between the absorbent layer 2 and the graded transition layer.

In FIG. 4, it can be observed that including the doping plane 7 makes it possible to eliminate the potential barrier in the conduction band, thereby improving operation at moderate bias voltages (better collection at low illumination, which should lead to digital transmission via an improved reception threshold).

The energy levels in FIG. 4 correspond to n-type residual doping in the vicinity of $10^{15}/cm^3$.

It is important to determine accurately the charge of the doping plane 7 so as to avoid a situation in which holes are trapped in the vicinity of the negatively biased contact. This can be done from the Poisson equation which governs the dependency of the electric field in a structure as a function of charge ($dE/dx=qN/\epsilon$). Charge is a function of residual doping characteristic of the epitaxial technique used, of the distribution of the forbidden band energy difference between the conduction band and the valence band (about 70% –30% for the AlInAs/GaInAs system), of the thickness of the transition zone, and of the shape of the device. Assuming that the materials have very low n-type residual doping (about $10^{15}/cm^3$), a thickness of about 2 µm for the absorbent layer 2, an interelectrode spacing of 2 µm, and a thickness of 200 nm for the transition zone 3, then the charge to be included in the plane is p-type doping of the order of $10^{11}/cm^2$.

This charge serves to compensate the initial field associated with the graded conduction band in the transition zone 5. Thus, because of the doping plane 7, a structure is provided which collects charge carriers properly.

The doping plane 7 is of p type, since the residual doping is of n type, and to a lesser degree because the discontinuity of the conduction band between AlInAs and GaInAs is greater than that of the valence band. The value of the charge depends on the geometry of the device and on the residual doping of the epitaxial layers.

It will also be observed, assuming that the doping of the epitaxial layers is zero, that the band diagram without the doping plane shows up two barriers: one associated with the difference of energy level in the conduction band; the other associated with the difference of energy level in the valence band. Applying a bias voltage makes it possible to eliminate the barrier associated with the valence band discontinuity long before that associated with ΔEc. In practice, the effect of residual doping is predominant.

A photodiode of the type described above is made using conventional epitaxial techniques, e.g. by means of molecular beams.

For a description of such techniques, reference may advantageously be made to the following publication:

[6] A. Temmar et al., "Photodiode de type métal-semiconducteur-métal (MSM) sur substrat InP" [A metal-semiconductor-metal (MSM) type photodiode on an InP substrate], Journal de Physique III (1996).

On the substrate 3, which is preferably an InP substrate, there is grown initially a buffer layer 3A of AlInAs having a thickness of 200 nm, followed by a layer 4 of graded composition going from AlInAs to GaInAs and having a thickness of 200 nm. This graded layer 4 serves to push any charge carriers back towards the active layer 2 and thus avoid any trapping of charge close to the interface. Thereafter the active photosensitive layer 2 of GaInAs is grown epitaxially to a thickness of 1 µm to 2 µm so as to absorb the major portion of incident photons. On this active layer, there is deposited the layer 5 of graded composition whose composition varies from GaInAs to AlInAs over a thickness that is typically 100 nm to 300 nm. When this layer begins to be grown, a p-type charge is inserted in the form of a doping plane 7, which layer is very thin and very highly doped ($10^{11}/cm^2$). This doping plane can be obtained by depositing a monolayer fraction of a p-dopant (e.g. beryllium) or by doping AlGaInAs at a rate in the vicinity of $10^{18}/cm.^{-3}$ over about 20 nm. It should be observed that the doping plane 7 may also be inserted at the end of growing the absorbent layer.

In a variant, it may be observed that the graded composition transition zone 5 can be obtained by juxtaposing a plurality of layers having different forbidden band energies that increase from the photosensitive sensitive layer to the barrier layer 6 of AlInAs, or indeed by modulating the period of a superlattice structure.

After the barrier layer 6 has been deposited, e.g. using AlInAs (to a thickness of 30 nm), techniques that are also known per se and described, for example, in the above-mentioned publication [6] are used to deposit the electrodes 1 of the photodiode.

The AlInAs material having a Schottky barrier height that is very similar both for electrons and for holes appears to be a better choice of material for the barriers 6 than InP. Nevertheless, the invention naturally also applies to structures in which the barriers are made of InP.

What is claimed is:

1. A metal-semiconductor-metal photodetector comprising:

an absorbent layer of a material having a determined forbidden band energy;

a barrier layer of a material having a determined forbidden band energy on which there are deposited Schottky electrodes, the forbidden band energy of the material of the barrier layer being greater than the forbidden band energy of the material of the absorbent layer;

a transition layer of graded composition interposed between said absorbent layer and said barrier layer; and a doping plane interposed between the absorbent layer and the transition layer of graded composition.

2. The photodetector of claim 1, wherein the doping plane is of p type.

3. The photodetector of claim 1, wherein the absorbent layer is of GaInAs, with the graded composition transition layer being of AlGaInAs.

4. The photodetector of claim 3, further comprising a buffer layer of AlInAs and a graded composition layer of AlGaInAs, on a substrate the materials arranged in the following order from the substrate:

the buffer layer of AlInAs;

the graded composition layer of AlGaInAs;

the absorbent layer of GaInAs;

the doping plane;

the transition layer of AlGaInAs; and the barrier layer on which electrodes are deposited.

5. The photodetector of claim 1, wherein the barrier layer is of AlInAs.

6. The photodetector of claim 1, wherein the barrier layer is of InP.

7. The photodetector of claim 1, wherein the substrate is an InP substrate.

* * * * *